United States Patent
Chen

(10) Patent No.: US 11,456,031 B2
(45) Date of Patent: Sep. 27, 2022

(54) WRITE LEVELING A MEMORY DEVICE USING WRITE DLL CIRCUITRY

(71) Applicant: Micron Technology, Inc., Boise, ID (US)

(72) Inventor: Liang Chen, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 40 days.

(21) Appl. No.: 17/116,634

(22) Filed: Dec. 9, 2020

(65) Prior Publication Data

US 2022/0180918 A1 Jun. 9, 2022

(51) Int. Cl.
*G11C 11/4096* (2006.01)
*G11C 11/4076* (2006.01)
*G06F 3/06* (2006.01)

(52) U.S. Cl.
CPC .......... *G11C 11/4096* (2013.01); *G06F 3/061* (2013.01); *G06F 3/0659* (2013.01); *G06F 3/0673* (2013.01); *G11C 11/4076* (2013.01)

(58) Field of Classification Search
CPC . G11C 11/4096; G11C 11/4076; G06F 3/061; G06F 3/0659; G06F 3/0673
See application file for complete search history.

(56) References Cited

U.S. PATENT DOCUMENTS

| | | | |
|---|---|---|---|
| 6,762,974 B1 * | 7/2004 | Johnson | G11C 7/1072 365/194 |
| 7,961,533 B2 * | 6/2011 | Searles | G06F 13/1689 365/194 |
| 9,305,622 B1 * | 4/2016 | Jeter | G11C 7/222 |

* cited by examiner

*Primary Examiner* — Idriss N Alrobaye
*Assistant Examiner* — Richard B Franklin
(74) *Attorney, Agent, or Firm* — Fletcher Yoder, P.C.

(57) ABSTRACT

A host device and memory device perform internal write leveling of a data strobe with a write command. The memory device includes an input-output interface that receives the data strobe from the host device. The memory device also includes internal write circuitry configured to launch an internal write signal. The internal write circuitry includes an emulation loop configured to emulate circuitry in a clock path of a write clock generated from the clock and used to generate a feedback clock. The internal write circuitry includes a write delay lock loop configured to receive the write clock and the feedback clock to determine a number of cycles used for the loop, transmit the number of cycles to the host device to be used as a cycle adjust in an internal write leveling process, and complete the internal write leveling process with the host device using the cycle adjust.

20 Claims, 8 Drawing Sheets

WRITE LEVELING A MEMORY DEVICE USING WRITE DLL CIRCUITRY

BACKGROUND

Field of the Present Disclosure

Embodiments of the present disclosure relate generally to the field of semiconductor devices. More specifically, embodiments of the present disclosure relate to determining when to launch an internal write signal using internal write leveling using write delay lock loop (DLL) circuitry in memory devices.

Description of Related Art

Semiconductor devices (e.g., memory devices) utilize timings with phase shifts of data signals, data strobes, and/or other signals to perform operations. Data strobes are used to capture data. To ensure that the data strobes are timed properly to capture data signals into the memory device, write leveling may be used to adjust timing for the data strobes to ensure that the data signals are captured properly. Write leveling in double-data rate type 5 (DDR5) dynamic random access memory (DRAM) devices may utilize internal and external write leveling. The internal write leveling may include two stages, course write leveling and fine write leveling, to achieve a high level of accuracy. However, each of these stages may take time to complete. Furthermore, processes utilizing these multi-stage write leveling techniques may utilize a process that may be susceptible to errors in write leveling inherent in the coarse write leveling process and/or that are caused at least in part due to power bus noise or temperature drifting in the semiconductor devices.

Embodiments of the present disclosure may be directed to one or more of the problems set forth above.

DETAILED DESCRIPTION

Figure 1:
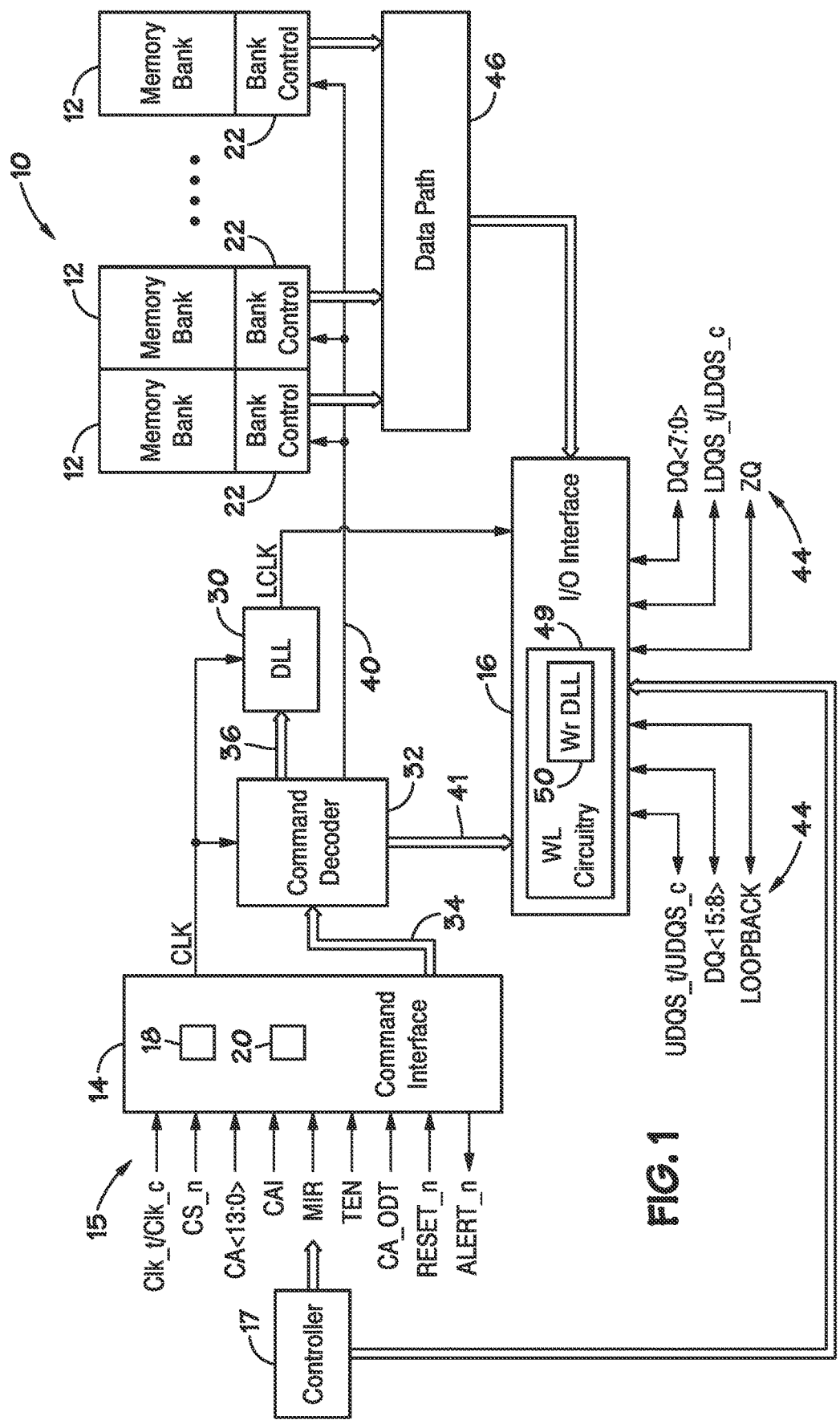
FIG. 1 is a simplified block diagram illustrating certain features of a memory device having write leveling (WL) circuitry, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, to ensure that the data strobe (DQS) is timed properly to capture data signals (DQ), write leveling may be used to adjust a relationship between the DQS and an internal write signal (IWS). In some embodiments, write leveling may be employed at powerup of a memory device, during a clock change, and/or due to system-level decisions (e.g., when too much variation occurs on clocking and clocking is reset). Write leveling may be classified as external write leveling and/or internal write leveling. Write leveling includes sending signals back to a host device telling the host device whether the DQS was able to be used to capture DQ signals. If the DQS does not enable proper capture of the DQ signals, the host device may shift the DQS until the DQS is able to capture the DQ signals.

Write leveling utilizes write leveling (WL) circuitry to launch the IWS after a write is received from the host device and may be performed using instructions from the host device. The WL circuitry may include a write delay lock loop (WrDLL) that may be used to reduce a duration of and/or eliminate at least some stages (e.g., coarse internal write leveling) that may be used in traditional counter-based write leveling training methods. Write leveling may include external write leveling used to align a data strobe (DQS) and an external clock (XCLK) from a host device (e.g., processor) at the pins of the memory device. Due to the nature of a counter-based internal coarse write leveling, the internal write leveling may have a maximum offset between the DQS and the XCLK plus or minus half of a clock cycle (0.5 tck) before performing fine tune adjustment. To remove this course delay error, the WrDLL may be utilized to remove the intrinsic training error prior to a fine adjustment stage of the write leveling operation.

Furthermore, since DQS and the internal write path have two different domains, a propagation delay from each path may vary. The voltage/temperature sensitivity of each path may also be different. To address these issues, the WL circuitry may be used to mitigate the DQS offset by synchronizing the WrDLL to an external clock phase that is also trained to align with the external DQS during external write leveling. By transmitting the output of the WrDLL through a mock external DQS path, an internal write signal (IWS) may track with external DQS voltage and temperature variations that is not possible with two different powerbus conditions and physical locations on other implementations of write leveling. In other words, the WrDLL-based WL circuitry may reduce a training error by removing an intrinsic DQS offset from previous write leveling implementations while also reducing write leveling error sensitivity to voltage and temperature drift. Furthermore, by removing the coarse write leveling stage by using the WrDLL, the WL circuitry may be used to maintain a hand-shaking margin used to negotiate timing between the host device and the memory device.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device, such as a controller 17 that may be embodied as a processor and/or other host device. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complimentary or bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. Additionally or alternatively, the command decoder may send internal write signals 41 to the IO interface 16. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0>bus. Access to specific banks 12 within the memory device 10 is encoded on the CA<13:0>bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving signals 44 (e.g., data and/or strobes to capture the data) through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS. The DQS is driven by the external processor or controller sending the data (e.g., for a write command) or by the memory device 10 (e.g., for a read command). For read commands, the DQS is effectively additional data output (DQ) signals with a predetermined pattern. For write commands, the DQS is used as clock signals to capture the corresponding input data. As with the clock signals (Clk_t and Clk_c), the DQS may be provided as a differential pair of data strobe signals (DQS_t and DQS_c) to provide differential pair signaling during reads and writes. For certain memory devices, such as a DDR5 SDRAM memory device, the differential pairs of DQS may be divided into upper and lower data strobe signals (e.g., UDQS_t and UDQS_c; LDQS_t and LDQS_c) corresponding to upper and lower bytes of data sent to and from the memory device 10, for instance.

The DQS are driven by the controller 17 to the memory device 10 to strobe in write data. When the write operation is complete, the controller 17 will stop driving the DQS and allow it to float to an indeterminate tri-state condition. To ensure that the DQS is timed properly to capture DQ signals in the memory device 10, write leveling may be used to adjust the DQS. In some embodiments, write leveling may be employed at powerup of the memory device 10, during a clock change, and/or due to system-level decisions (e.g., when too much variation occurs on clocking and clocking is reset). Write leveling may be divided into external write leveling and internal write leveling. External write leveling includes the memory device 10 sending signals back to the controller 17 telling the controller 17 whether the DQS was able to be used to capture DQ signals. If not, the controller 17 may shift the DQS if the DQS are able to capture the DQ signals.

Internal write leveling is performed for the memory device 10 with instructions from and based on a hand-shake process with the controller 17. Internal write leveling utilizes write-leveling (WL) circuitry 49 to launch an internal write signal (IWS). For example, the WL circuitry 49 may cause the launch to occur some number (N) of cycles (tck) earlier than the programmed CWL for the memory device 10 to ensure that the internal DQS may capture the IWS. The DQS may be inherently faster than the IWS. Thus, the memory device 10 may launch the IWS earlier than the CWL. For example if the CWL is programmed to 28 cycles, then the IWS would nominally be launched 28 cycles after the external write command enters the memory device. However, without adjustment, the IWS may be late with respect to the internal DQS that captures the IWS. Thus, the IWS may be released earlier than the CWL tcks. Additionally or alternatively, the internal DQS may be delayed in the WL circuitry 49 to align with the IWS. The WL circuitry 49 may include any circuitry included in U.S. Pat. No. 10,452,319, entitled "Write Leveling a Memory Device," filed on Jun. 26, 2018, U.S. Pat. No. 10,418,090, entitled "Internal Write Leveling Circuitry," filed on Jun. 21, 2018, or U.S. patent application Ser. No. 16/786,661, filed on Feb. 10, 2020, each of which is incorporated herein for all purposes.

Additionally, as illustrated, the WL circuitry 49 may include a write delay lock loop (WrDLL) circuitry 50 that may be used to align a write/reference clock generated from the IWS path to a feedback clock that passed through emulation circuitry used to emulate at least a portion of the IWS path. By aligning these signals, the memory device 10 may bypass and/or expedite coarse internal write leveling stages reducing the time used to perform WL.

Returning to FIG. 1, an impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
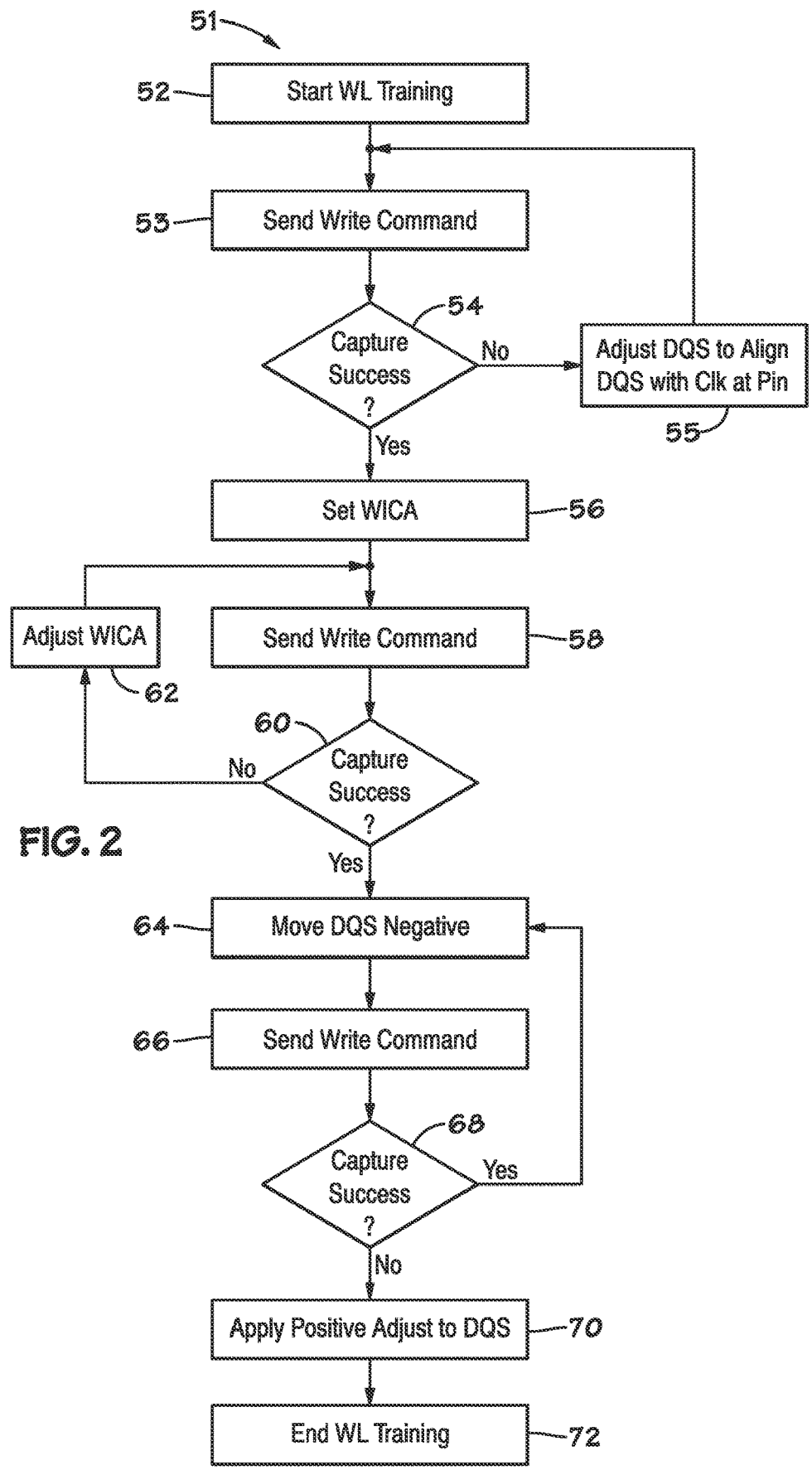
FIG. 2 is a flow diagram of a write leveling process that may be performed by a controller to write level train the memory device of FIG. 1, in accordance with an embodiment.

FIG. 2 is a flow diagram of a process 51 that may be employed by the controller 17 to perform write leveling with the memory device 10. In some embodiments, the process 51 may be executed by the controller 17 as a host device using instructions stored in non-transitory, tangible, and computer-readable memory and executed by the controller 17 to perform the steps of the process 51. The controller 17 starts write leveling training (block 52). For example, the controller 17 may write a bit to a mode register to cause the memory device to enter a write leveling training mode. To initiate the write leveling, the controller 17 first synchronizes DQS and clock signals at pins of the memory device 10. To perform this synchronization, the controller 17 sends a write command to the memory device 10 (block 53). The controller 17 then waits for an indication of a successful capture of the write command in the memory device 10 (block 54). The successful capture may be a sampling of an internal write signal (IWS) using the DQS. A successful capture may be indicated by a first value (e.g., 1) while an unsuccessful capture may be indicated by a second value (e.g., 0). When the memory device is not captured successfully, the controller 17 adjusts DQS to align DQS with the clock at the pins of the memory device 10 (block 55). If the DQS is captured successfully, the controller 17 may deem that the external write leveling stage has been completed and begin performing internal write leveling.

After the DQS-to-Clk timing has been set using external write leveling, the controller 17 performs internal write leveling to determine how many cycles earlier than CWL to fire the IWS and/or how to align DQS with the IWS. The controller 17 then sets a write internal cycle adjust (WICA) value to a mode register as an indication of how soon the WL circuitry 49 is to launch the IWS or how many cycles to delay DQS to align with a pulse of the IWS (block 56). In some embodiments, a start adjustment may be applied to DQS before or during the WICA setting. The start adjustment may be defined in the DDR5 specification to enable the memory device 10 and controller 17 to find the leading edge of the pulse of the IWS. An end adjustment applied at the end of the write leveling may place the DQS in the middle of the IWS pulse.

For example, WICA may be selected to start at an initial number (e.g., −3, 0, 5, etc.) of cycles. The controller 17 then sends a write command to the memory device 10 (block 58). The controller 17 then determines whether the write command was captured properly (block 60). For example, the controller 17 may receive an indication from the memory device 10 that indicates whether the DQS was sufficiently aligned to capture the write command properly. If the command was not captured properly, the controller 17 adjusts WICA (block 62) and re-attempts to capture the write command.

Once a write command has been captured properly, the controller 17 has found the proper WICA value to be used and coarse stage internal write leveling has been completed meaning that DQS is within a clock cycle of the launch of the IWS. However, the controller 17 may also perform fine tuning to ensure that DQS is aligned within the clock cycle. As part of fine tuning, the controller 17 may move DQS negative (block 64). For example, the movement may be a minimum step size of the controller 17. After the DQS has been moved, the controller 17 sends a write command to the memory device 10 (block 66). The controller 17 then determines whether the capture was successful (block 68). For example, in some embodiments, the controller 17 may determine whether the capture was successful based on an indication from the memory device 10 whether the write command was captured properly. Since fine tuning looks for a failure edge, if the command was captured properly, the controller 17 moves the DQS more negative until a failure point is found. When the write command is not captured, the controller 17 may shift the DQS in a positive direction (block 70). Since the controller 17 has found the failure edge, the controller 17 may shift DQS by 0.5 tck as the previously discussed end adjustment to center the DQS in the IWS pulse and to allow for DQS variation. Once external write leveling, coarse internal write leveling, and fine tuning have been completed, the controller 17 ends write leveling (block 72).

Figure 3:
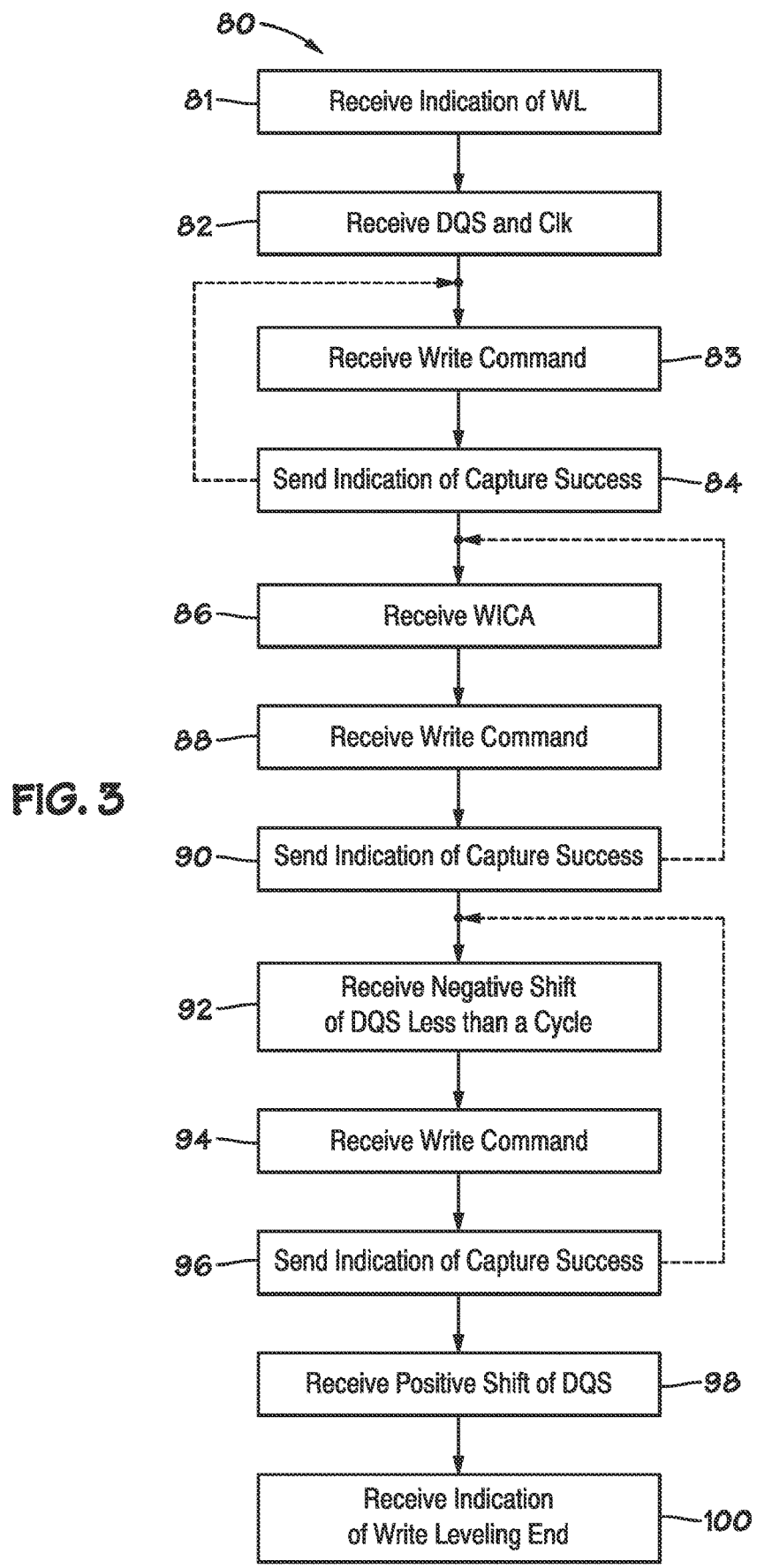
FIG. 3 is a flow diagram of a write leveling process that may be performed by the memory device to train the memory device of FIG. 1, in accordance with an embodiment.

FIG. 3 is a flow diagram of a process 80 that may be employed by the memory device 10 during the write leveling training of the controller 17. The memory device 10 receives an indication of write leveling (block 81). For example, the controller 17 may set a mode register (e.g., MR2.b0 or MR.b1) to indicate that write leveling training mode is starting. During the write leveling training mode, the memory device 10 receives the DQS and a Clk from the controller 17 (block 82). The memory device 10 receives a write command from the controller 17 (block 83). The memory device 10 then sends an indication of whether the IWS was captured successfully at the pin of the memory device 10 (block 84). If the IWS is not captured successfully, the controller 17 may adjust DQS and return the process 80 to block 83.

Once the controller 17 aligns the DQS and the Clk at respective pins of the memory device 10 as part of external write leveling, coarse internal write leveling begins. The memory device 10 receives the WICA from the controller 17 (block 86). For example, in some embodiments, the controller 17 may write a value to a mode register of the memory device 10 setting the WICA (e.g., multiple bits, such as MR13.b3:b0). After receiving the WICA, the memory device 10 receives a write command from the controller 17 (block 88). As part of receiving the write command, the memory device 10 launches an IWS and DQS based on the value of WICA and the CWL. The memory device 10 then sends an indication of whether the IWS was captured successfully (i.e., IWS arrives with first edge of the DQS) using the DQS (block 90). If the IWS is not captured successfully, the controller 17 may adjust WICA thereby returning the process 80 to block 86. However, if the IWS is captured successfully, the correct cycle has been identified and coarse internal write leveling has been completed. Thus, with the coarse internal write leveling being completed, and a fine tuning portion of write leveling begins to identify a location within the cycle.

As part of fine tuning, the memory device 10 receives a negative shift of the DQS (block 92). In some embodiments, the DQS-to-Clk relationship may be maintained by moving both the DQS and the Clk together. Furthermore, the negative shift of the DQS may be less than a whole cycle of the DQS. For instance, the negative shift may be a minimum step size for the DQS by the controller 17. As previously noted, fine tuning looks for the failure edge of the DQS. Accordingly, the memory device 10 receives a write operation as part of the fine tuning (block 94). As part of receiving the write operation, the IWS is captured properly with the DQS. The memory device 10 sends an indication to the controller 17 indicating whether the IWS was captured successfully (block 96). If the controller 17 determines that the IWS was captured successfully, it determines that the failure edge of the DQS has not been found. Accordingly, the controller 17 would then keep shifting the DQS in the same direction until the IWS is not captured successfully establishing a location within the DQS cycle for the failing edge. Once the IWS is not properly captured, the memory device receives a positive shift of the DQS away from the failing edge (block 98). For example, to move the DQS to a likely safe location, the controller 17 may shift the DQS in a positive location by 0.5 tck. Once this positive shift has been received, write leveling has completed, and the memory device 10 may receive an indication of write leveling ending (block 100). For example, the mode register used to start the write leveling training mode may be reverted from the state set in block 82. Although the foregoing discusses finding a failing edge of capture using negative shifts of the DQS until failure followed by a positive shift to a safe location, the failing edge may additionally or alternatively be found by positive shifts of the DQS until failure followed by a negative shift to a safe location.

Figure 4:
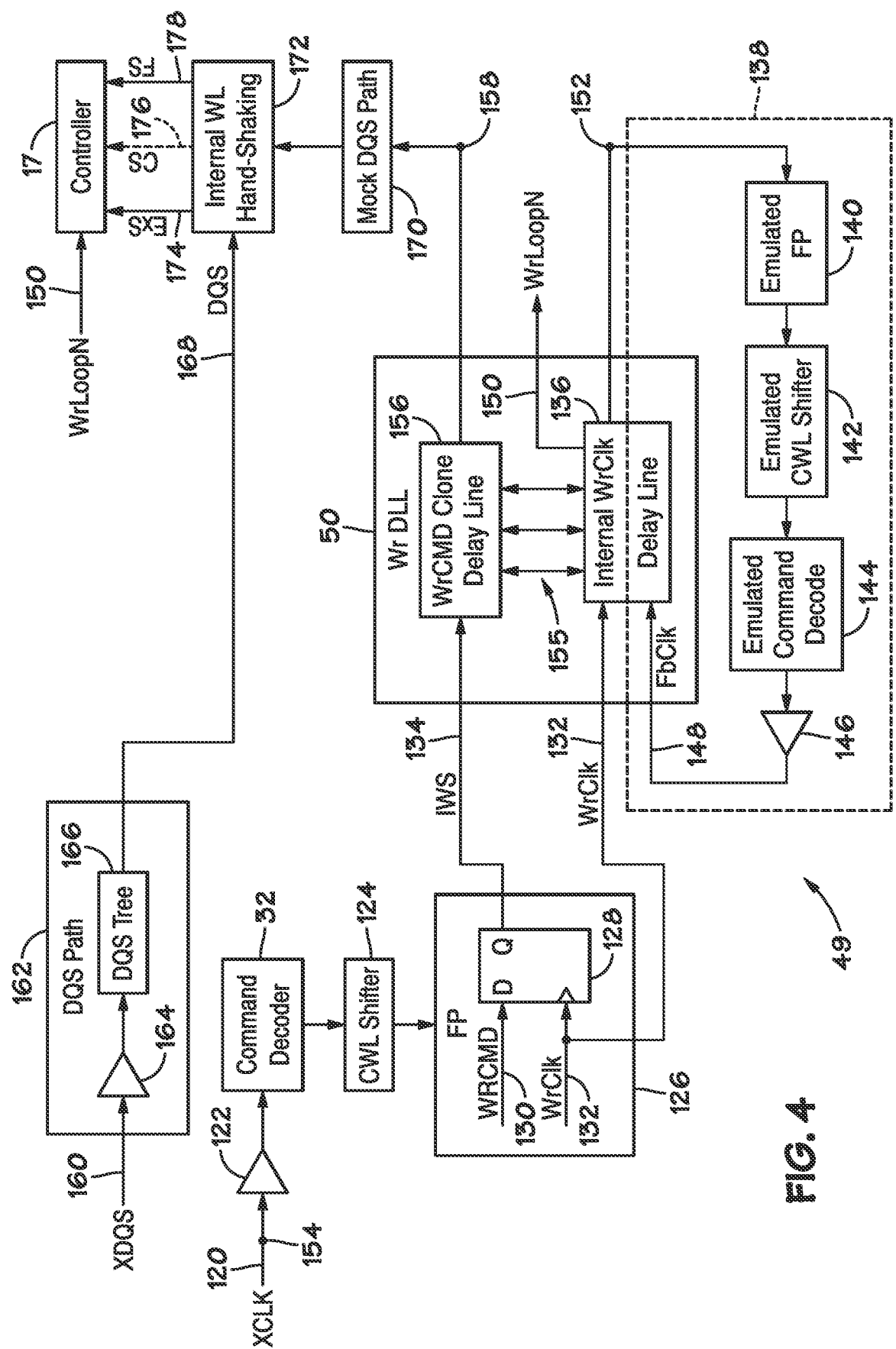
FIG. 4 is a block diagram of the WL circuitry of FIG. 1 having a write delay lock loop (WrDLL), in accordance with an embodiment.

As previously discussed, WrDLL circuitry 50 may be used to reduce and/or eliminate the coarse write leveling stage. Furthermore, the use of the WrDLL circuitry 50 may reduce a maximum error that may occur in write leveling DQS and IWS. FIG. 4 is a block diagram of the WL circuitry 49 having the WrDLL circuitry 50. As illustrated, the memory device 10 receives an external clock (XCLK) 120 from the controller 17. For instance, the XCLK 120 may be/be derived from the Clk_t in FIG. 1. The XCLK 120 is received at an input buffer 122 of the memory device 10 in the command interface 14. The input buffer 122 then transmits the XCLK 120 to the command decoder 32. The XCLK 120 and the decoded write command are transmitted to a column access strobe (cas) write latency (CWL) shifter 124 configured to shift the write command by at least a portion of the CWL for the memory banks 12. The write command and the XCLK 120 are transmitted through a write forward path (FP) 126 from the CWL shifter 124 to a DQS area of the memory device 10. The FP 126 may include multiple components including traces, wiring, delays, flip flops, latches, and/or other routing circuitry used to transmit the write command and the XCLK 120. For instance, the FP 126 may include a flip flop 128 that receives a delayed write command (WRCMD) 130 at an input of the flip flop 128. The flip flop 128 also receives a write clock (WrClk) 132 that is derived from the XCLK 120. The WrClk 132 causes the flip flop 129 to output a pulse of IWS 134 when WRCMD 130 is asserted on a clock edge of the XCLK 120. The IWS 134 may be the same as the internal write signals 41 and/or may be derived from the internal write signals 41. The IWS 134 and the WrClk 132 are both transmitted to the WrDLL circuitry 50, and since both use the same clock, the IWS 134 and the WrClk 132 are from the same phase.

The WrClk 132 is transmitted to an internal WrClk delayline 136 of the WrDLL circuitry 50. The internal WrClk delayline 136 applies an amount of delay applied to the WrClk 132 before passing the delayed WrClk 132 to an emulation loop 138. The emulation loop 138 emulates circuitry between the external pin receiving the XCLK 120 at the memory device 10 and the WrDLL circuitry 50. For instance, the emulation loop 138 may include an emulated FP 140, an emulated CWL shifter 142, an emulated command decoder 144, and an emulated input buffer 146. The emulated components may perform similar functionality provided by their counterparts that they are emulating. Alternatively, the emulated components may provide an emulation of the delay occurring in the path to the WrDLL circuitry 50 from the pin used to receive XCLK 120. For example, the emulated FP 140, the emulated CWL shifter 142, the emulated command decoder 144, and the emulated input buffer 146 may emulate delays in the FP 126, CWL shifter 124, the command decoder 32, and the input buffer 122, respectively. Additionally or alternatively, some embodiments of the memory device 10, may include a single delay circuit configured to emulate the delays in the FP 126, CWL shifter 124, the command decoder 32, and the input buffer 122. After the delayed WrClk 132 is transmitted through the emulation loop 138, it is fed back to the internal WrClk delayline 136 as a feedback clock (FbClk) 148. The internal WrClk delayline 136 locks the FbClk 148 as aligned (e.g., in phase) with the WrClk 132. The internal WrClk delayline 136 also transmits a WrLoopN signal 150 that indicates a number of cycles between the WrClk 132 and the FbClk 148. Alternatively, the internal WrClk delayline 136 may indicate a duration of delay that is converted to a number of cycles as the WrLoopN signal 150. The conversion may be made in the WrDLL circuitry 50, other locations in the memory device 10, and/or in the controller 17. As indicated, this WrLoopN signal 150 and/or a raw loop delay duration may be transmitted to the controller 17. For instance, a value in the WrLoopN signal 150 may be transmitted to the controller 17 using a mode register between the memory device 10 and the controller 17. As discussed below, this WrLoopN signal 150 may be used to set the WICA in coarse write leveling or may be used to remove coarse write leveling stage from the internal write leveling previously described instead substituting the WrLoopN signal 150 for the WICA determination steps.

By aligning the WrClk 132 and the FbClk 148 as transmitted into the internal WrClk delayline 136, the WrDLL circuitry 50 aligns nodes 152 and 154. Furthermore, after the internal WrClk delayline 136 is locked, a lock location 155 is synchronized with a WrCMD clone delayline 156 used to delay the IWS 134 that is to be used for internal write leveling (and for write commands in general). The synchronization of the internal WrClk delayline 136 and the WrCMD clone delayline 156 causes nodes 152 and 158 to be in phase with each other.

For internal write leveling, the WL circuitry 49 receives an external DQS (XDQS) 160 via a pin of the memory device 10. The DQS is transmitted through a DQS path 162. The DQS path 162 includes an input buffer 164 and a DQS tree 166 that includes routing circuitry used to distribute DQS 168. The IWS 134, as delayed by the WrCMD clone delayline 156, is transmitted from the WrDLL circuitry 50 through a mock DQS path 170 used to emulate the DQS path 162. Internal write leveling hand-shaking circuitry 172 may perform internal write leveling using the DQS 168 and the IWS 134, as delayed by the WrCMD clone delayline 156. The internal write leveling hand-shaking circuitry 172 may be used to transmit an external sample (ExS) 174 to the controller 17 indicative of whether a sample of the write command is successful. In some embodiments, the internal write leveling hand-shaking circuitry 172 may transmit a coarse sample (CS) 176 to the controller 17 indicative of whether coarse write leveling has been completed with IWS being captured. However, as previously noted, in some embodiments, the coarse write leveling stage may be omitted using the WrLoopN signal 150 to replace at least a portion of the coarse write leveling determination. The internal write leveling hand-shaking circuitry 172 may be used to transmit a fine sample (FS) 178 to the controller 17 indicative of whether a sample of the write command is successful in the fine write leveling stage. In some embodiments, the ExS 174, the CS 176, and the FS 178 may be derived from a same location in the memory device 10 to capture the IWS. Alternatively, at least one of the ExS 174, the CS 176, and the FS 178 may be captured from different locations. For instance, the ExS 174 may be captured at or close to the pins used to receive DQS, the command, and/or the XCLK 120 while the FS 178 may be derived from more interior to the memory device 10. For instance, the FS 178 may indicate that the IWS has passed through the WrCMD clone delayline 156.

As may be appreciated, the determination of WrLoopN signal 150 may be based on the XCLK 120 without utilizing DQS. Accordingly, calculation of the WrLoopN signal 150 does not need to wait for external write leveling to be completed. Indeed, the determination of the WrLoopN signal 150 may be performed in parallel with the external write leveling independent of DQS alignment. Since, unlike coarse write leveling operations, the determination of the WrLoopN signal 150 may be calculated without waiting for the external write leveling, the calculation for the WrLoopN signal 150 may be performed prior to, during (e.g., in parallel with), or after the external write leveling stage. Furthermore, once the WrLoopN signal 150 is determined, it may be stored for multiple writes or modes of the memory device 10. For instance, the WrLoopN signal 150 may be derived after bootup, during manufacture, or any other periods previously discussed where write leveling training may be appropriate.

Figure 5:
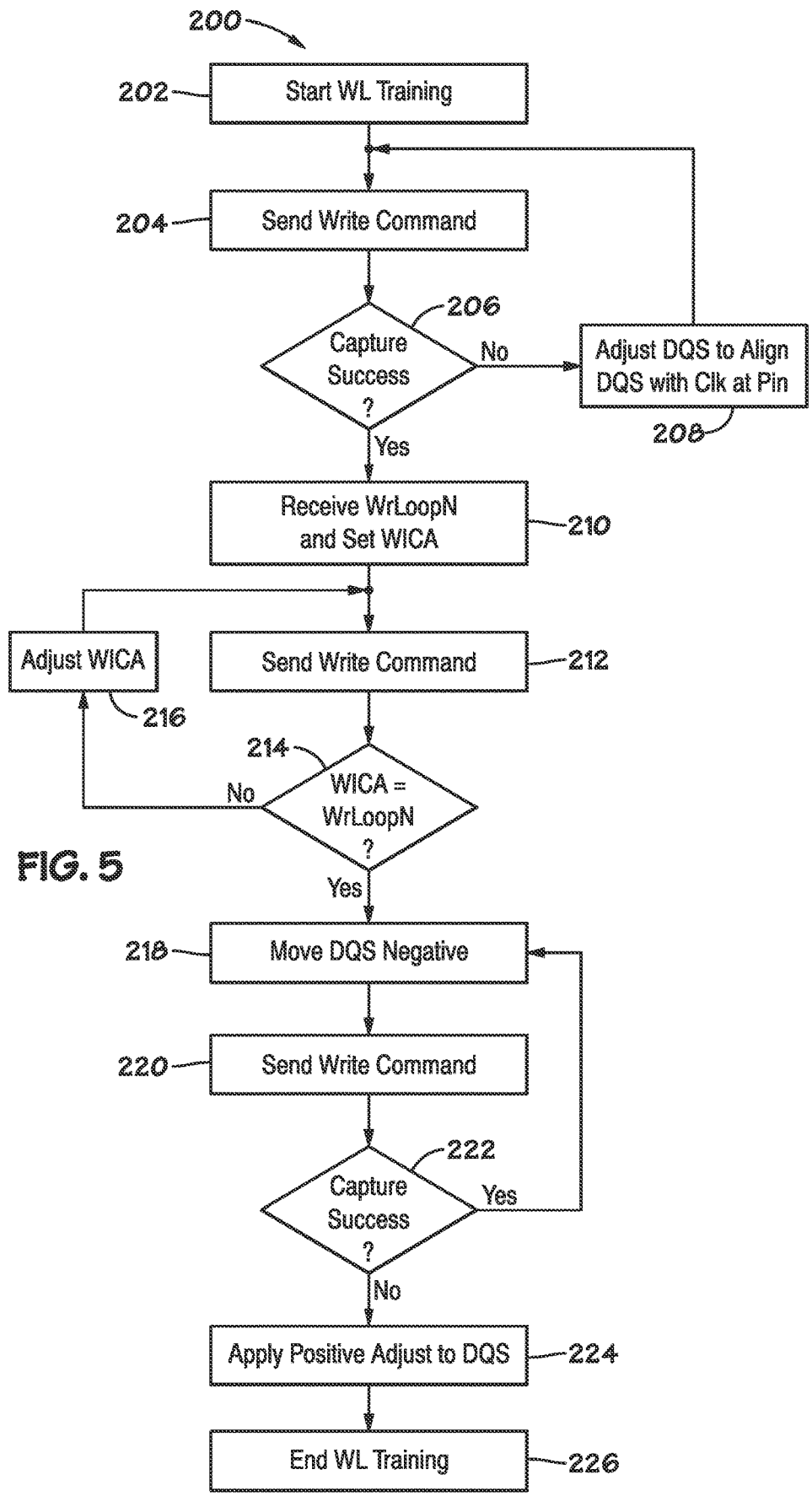
FIG. 5 is a flow diagram of a write leveling process that may be performed by a controller to write level train the memory device of FIG. 1 using the WrDLL of FIG. 4, in accordance with an embodiment.

FIG. 5 illustrates is a flow diagram of a process 200 that may be employed by the controller 17 to perform write leveling with the memory device 10 utilizing the WrDLL circuitry 50. The process 200 is similar to the process 51 except that the process 200 utilizes the WrLoopN signal 150 in the coarse write leveling stage. Similar to the process 51, the process 200 may be executed by the controller 17 as a host device using instructions stored in non-transitory, tangible, and computer-readable memory and executed by the controller 17 to perform the steps of the process 200. The controller 17 starts write leveling training (block 202). For example, the controller 17 may write a bit to a mode register to cause the memory device to enter a write leveling training mode. To initiate the write leveling, the controller 17 synchronizes DQS and clock signals at pins of the memory device 10. To perform this synchronization, the controller 17 sends a write command to the memory device 10 (block 204). The controller 17 then waits for an indication (e.g., a value via ExS 174) of a successful capture of the write command in the memory device 10 (block 206). When the memory device is not captured successfully, the controller 17 adjusts DQS to align DQS with the clock at the pins of the memory device 10 (block 208). If the DQS is captured successfully, the controller 17 may deem that the external write leveling stage has been completed and begin performing internal write leveling.

After the DQS-to-Clk timing has been set using external write leveling, the controller 17 performs internal write leveling to determine how many cycles earlier than CWL to fire the IWS and/or how to align DQS with the IWS. The controller 17 sets a write internal cycle adjust (WICA) value (e.g., via a mode register) as an indication of how soon the WL circuitry 49 is to launch the IWS and receives the WrLoopN signal 150 (block 210). As previously noted, the WrLoopN signal 150 may be determined before, during, or after external write leveling. Accordingly, in some embodiments, the controller 17 may receive the WrLoopN signal 150 during or before external write leveling rather than only after external write leveling, as discussed in relation to the process 51. In some embodiments, the start adjustment still may be applied to DQS before or during the WICA setting.

The controller 17 then sends a write command to the memory device 10 (block 212). The controller 17 then determines whether WICA is equal to the WrLoopN signal 150 (block 214). If WICA is different than the WrLoopN signal 150, the controller 17 adjusts WICA (block 216).

Once WICA is equal to the WrLoopN signal 150, the controller 17 has found the proper WICA value to be used and the coarse stage internal write leveling has been completed. However, the controller 17 may also perform fine tuning to ensure DQS is aligned more precisely. As part of fine tuning, the controller 17 may move DQS negative (block 218). For example, the movement may be a minimum step size of the controller 17. After the DQS has been moved, the controller 17 sends a write command to the memory device 10 (block 220). The controller 17 then determines whether the capture was successful (block 222). For example, in some embodiments, the controller 17 may determine whether the capture was successful based on an indication (e.g., FS 178) from the memory device 10 whether the write command was captured properly. When the write command is not completed successfully, the controller 17 may shift the DQS in a positive direction (block 224). Since the controller 17 has found the failure edge, the controller 17 may shift DQS by 0.5 tck as the previously discussed end adjustment to center the DQS in the IWS pulse and to allow for DQS variation. Once external write leveling, coarse internal write leveling, and fine tuning have been completed, the controller 17 ends write leveling training (block 226).

Figure 6:
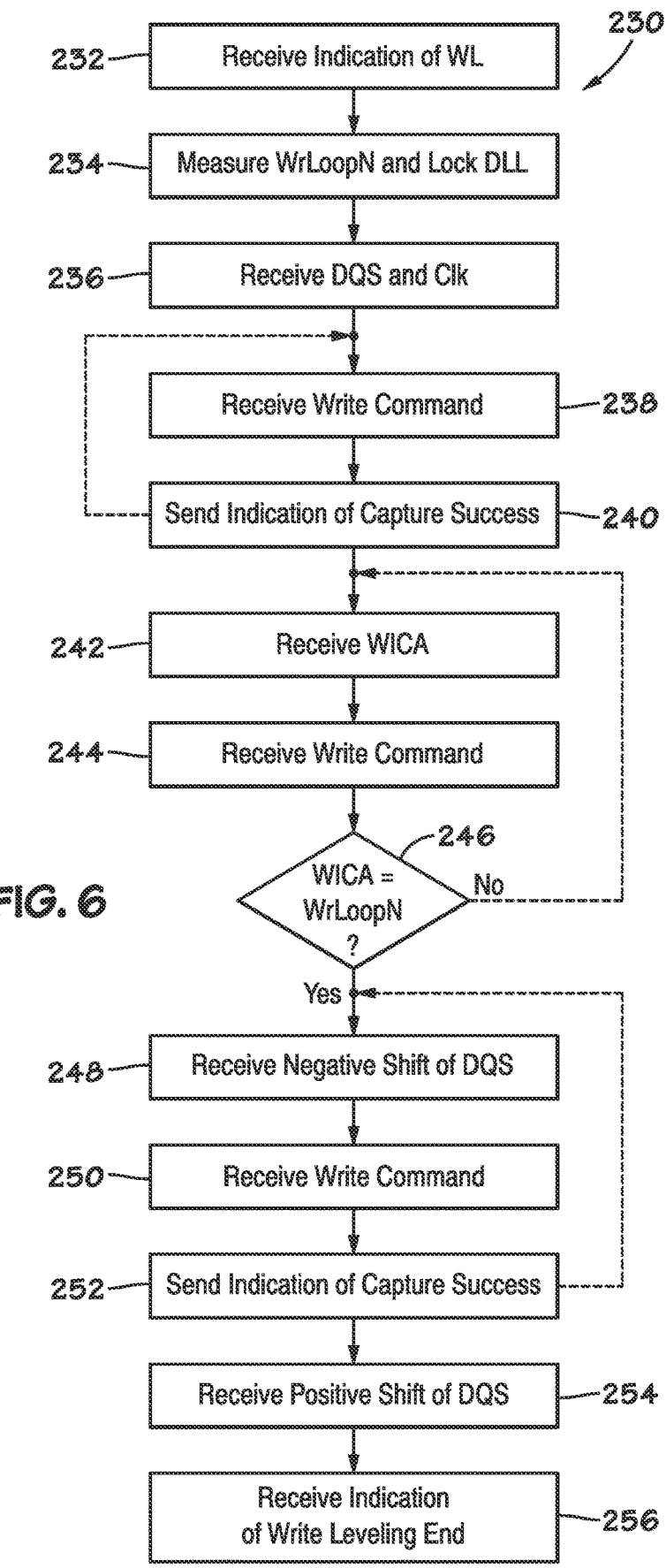
FIG. 6 is a flow diagram of a write leveling process that may be performed by the memory device to write level train the memory device of FIG. 1 using the WrDLL of FIG. 4, in accordance with an embodiment.

FIG. 6 is a flow diagram of a process 230 that may be employed by the memory device 10 during the write leveling training using the controller 17. The process 230 is similar to the process 80 except that the WrLoopN signal 150 is calculated and used in the coarse write leveling stage. The memory device 10 receives an indication of write leveling (block 232). For example, the controller 17 may set a mode register to indicate that write leveling training mode is starting. During or before the write leveling training mode, the memory device 10 (e.g., WrDLL circuitry 50) calculates the WrLoopN signal 150 (block 234). As previously indicated, this calculation may be performed during, before, or after the write leveling training. Furthermore, once the WrLoopN signal 150 has been calculated, the value may be shared with the controller 17 before, during, or after external write leveling training. Alternatively, the controller 17 may calculate the value of the WrLoopN signal 150 from an amount of delay determined in the WrDLL circuitry 50. In some embodiments, the WrLoopN signal 150 may be stored internally within the memory device 10 without sharing with the controller 17. Instead, the WrLoopN signal 150 is used to verify whether coarse write leveling has been completed without having to attempt to capture a write command potentially causing the change from previous implementations to be hidden from the controller 17.

During, after, or before calculating the value of the WrLoopN signal 150, the memory device 10 receives the DQS and a Clk from the controller 17 (block 236). The memory device 10 receives a write command from the controller 17 (block 238). The memory device 10 then sends an indication (e.g., ExS 174) of whether the IWS was captured successfully at the pin of the memory device 10 (block 240). If the IWS is not captured successfully, the controller 17 may adjust DQS and return the process 230 to block 238.

Once the controller 17 aligns the DQS and the Clk at respective pins of the memory device 10 as part of external write leveling, coarse internal write leveling begins. The memory device 10 receives the WICA from the controller 17 (block 242). For example, in some embodiments, the controller 17 may write a value to a mode register of the memory device 10 setting the WICA. After receiving the WICA, the memory device 10 receives a write command from the controller 17 (block 244). As part of receiving the write command, the memory device 10 launches an IWS and DQS based on the value of WICA and the CWL. As previously discussed, the WrLoopN signal 150 may be used in in the calculation of the WICA. However, in some embodiments, the coarse internal write leveling stage may proceed to comply with current DDR5 specifications. Yet, the WrLoopN signal 150 may be used to compare to the WICA directly potentially expediting the coarse internal write leveling step (block 246). This comparison may be performed in the memory device 10 and/or the controller 17. If WICA is not equal to the WrLoopN signal 150, the controller 17 may adjust WICA thereby returning the process 230 to block 242 after the controller 17 adjusts WICA. However, once WICA is equal to the WrLoopN signal 150, coarse internal write leveling has been completed.

The fine tuning in the process 230 is similar to the fine tuning in the process 80 except that the IWS captured for success passes through the FP 126 and the WrCMD clone delayline 156 that is set based at least in part on the emulation loop 138. Similar to the process 80, the memory device 10 receives a negative shift of DQS (block 248), receives a write operation as (block 250), and sends an indication of capture success (block 252.) However, in the process 230, the indication may be transmitted via the FS 178 that indicates that the IWS has traversed the WrCMD clone delayline 156 and been captured properly. Also similar to the process 80, once the IWS is not properly captured, the memory device 10 receives a positive shift of the DQS away from the failing edge (block 254) and receives an indication of write leveling ending (block 256).

Figure 7:
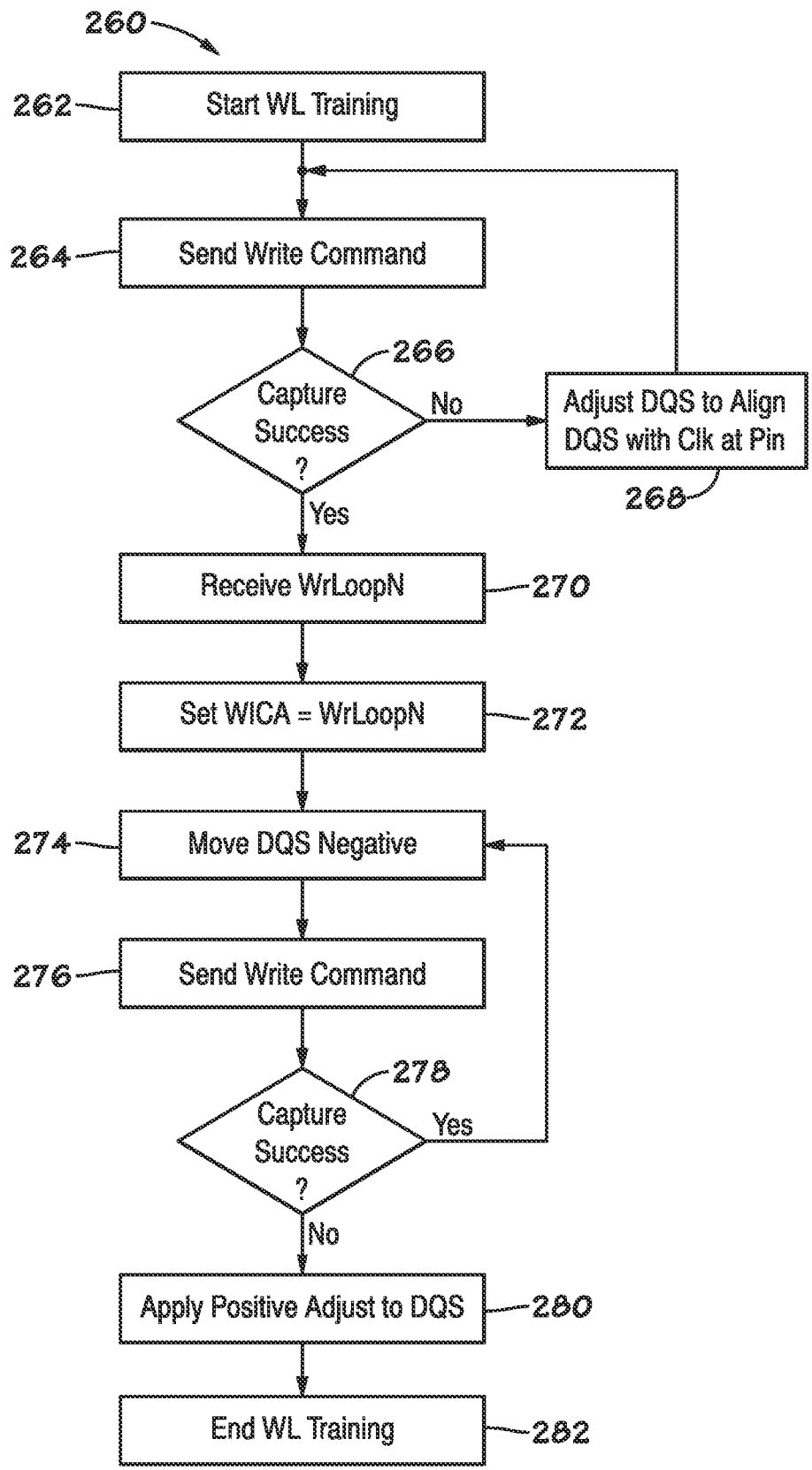
FIG. 7 is a flow diagram of a write leveling process that may be performed by a controller to write level train the memory device of FIG. 1 using the WrDLL of FIG. 4 to omit coarse write leveling training, in accordance with an embodiment.

Although the processes 200 and 230 apply coarse write leveling using the WrLoopN signal 150, since the WICA may be set directly to the value on the WrLoopN signal 150 while bypassing the coarse write leveling stage refinement steps altogether. FIG. 7 is a flow diagram of a process 260 that may be employed by the memory device 10 during the write leveling training using the controller 17. The process 260 is similar to the process 200 except that the WrLoopN signal 150 is calculated while bypassing the coarse write leveling stage. Similar to the processes 51 and 200, the process 260 may be executed by the controller 17 as a host device using instructions stored in non-transitory, tangible, and computer-readable memory and executed by the controller 17 to perform the steps of the process 200. The controller 17 starts write leveling training (block 262), sends a write command to the memory device 10 (block 264), and waits for an indication (e.g., a value via ExS 174) of a successful capture of the write command in the memory device 10 (block 266) as part of the external write leveling stage. When the memory device is not captured successfully, the controller 17 adjusts DQS to align DQS with the clock at the pins of the memory device 10 (block 268). If the DQS is captured successfully, the controller 17 may deem that the external write leveling stage has been completed and begin performing internal write leveling.

The controller 17 receives the WrLoopN signal 150 (block 270). The controller 17 then sets WICA to the value indicated in the WrLoopN signal 150 (block 272). As previously noted, the WrLoopN signal 150 may be determined and/or the WICA may be set before during or after external write leveling. Accordingly, in some embodiments, the controller 17 may receive the WrLoopN signal 150 during or before external write leveling rather than only after external write leveling. In some embodiments, the start adjustment may be applied to DQS before or during the WICA setting.

Once the WICA is set and the external write leveling training has completed, the controller 17 may also perform fine tuning tune DQS alignment. As part of fine tuning, the controller 17 may move DQS negative (block 274). For example, the movement may be a minimum step size of the controller 17. After the DQS has been moved, the controller 17 sends a write command to the memory device 10 (block 276). The controller 17 then determines whether the capture was successful (block 278). For example, in some embodiments, the controller 17 may determine whether the capture was successful based on an indication (e.g., FS 178) from the memory device 10 whether the write command was captured properly. When the write command is not completed successfully, the controller 17 may shift the DQS in a positive direction (block 280). Since the controller 17 has found the failure edge, the controller 17 may shift DQS by 0.5 tck as the previously discussed end adjustment to center the DQS in the IWS pulse and to allow for DQS variation. Once external write leveling, coarse internal write leveling, and fine tuning have been completed, the controller 17 ends write leveling training (block 282).

Figure 8:
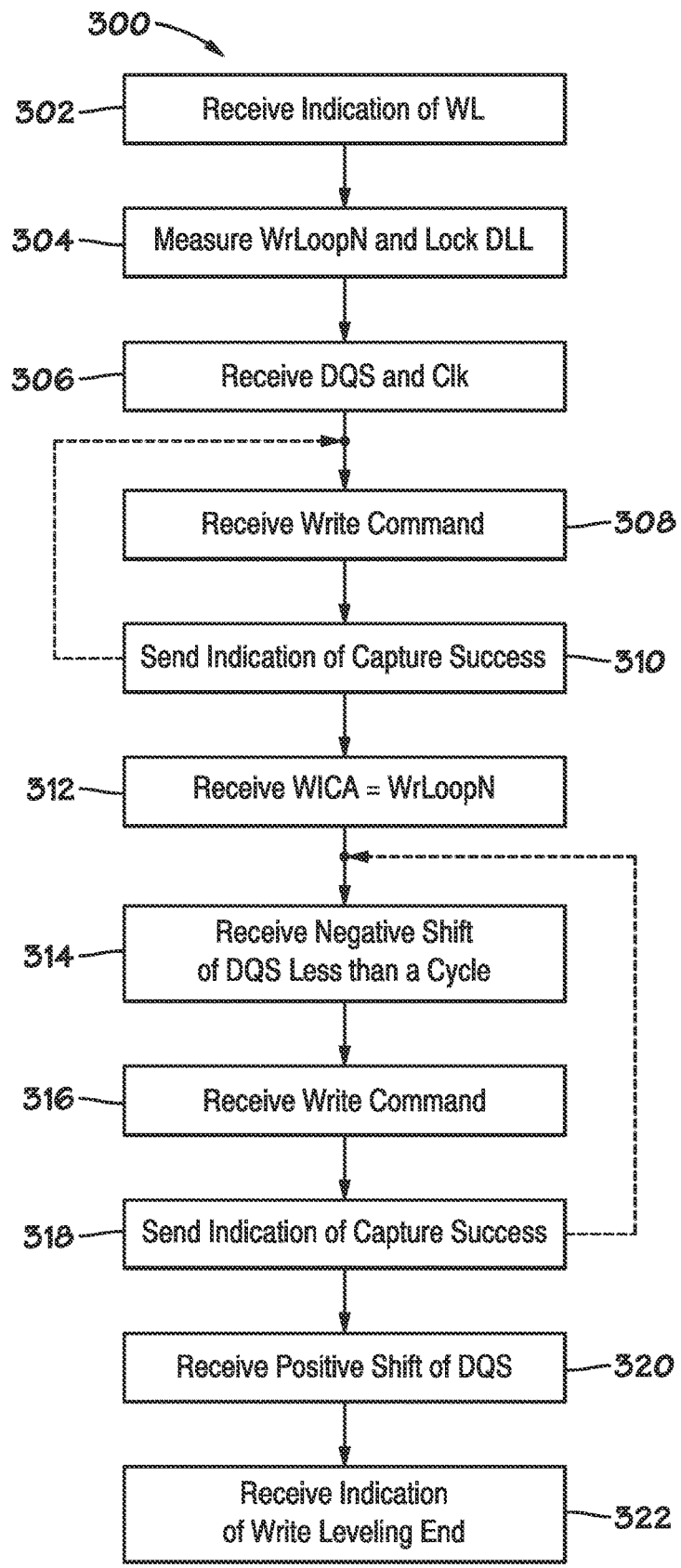
FIG. 8 is a flow diagram of a write leveling process that may be performed by the memory device to write level train the memory device of FIG. 1 using the WrDLL of FIG. 4 to omit coarse write leveling training, in accordance with an embodiment.

FIG. 8 is a flow diagram of a process 300 that may be employed by the memory device 10 during the write leveling training using the controller 17, omitting the coarse write leveling training stage. The process 300 is similar to the processes 80 and 230 except that the WICA is set to a value in the WrLoopN signal 150 without the iterative coarse write leveling training stage. The memory device 10 receives an indication of write leveling (block 302). For example, the controller 17 may set a mode register (e.g., MR2.b1) to indicate that write leveling training mode is starting. During the write leveling training mode, the memory device 10 (e.g., WrDLL circuitry 50) calculates the WrLoopN signal 150 and locks the DLL (block 304). As previously indicated, this calculation may be performed during, before, or after the write leveling stage. Furthermore, once the WrLoopN signal 150 has been calculated, the value may be shared with the controller 17.

During, after, or before calculating the value of the WrLoopN signal 150, the memory device 10 receives the DQS and a Clk from the controller 17 (block 306). The memory device 10 receives a write command from the controller 17 (block 308). The memory device 10 then sends an indication (e.g., ExS 174) of whether the IWS was captured successfully at the pin of the memory device 10 (block 310). If the IWS is not captured successfully, the controller 17 may adjust DQS and return the process 300 to block 308.

As previously discussed, the WrLoopN signal 150 may be used in in the set the WICA without completing the remaining steps of the coarse write leveling stages of the processes 80 and 200. Accordingly, the memory device 10 may receive WICA from the controller 17 set to the value of the WrLoopN signal 150 (block 312).

Like the fine tuning in the process 230, the fine tuning in the process 300 is similar to the fine tuning in the process 80 except that the IWS captured for success passes through the FP 126 and the WrCMD clone delayline 156 that is set based at least in part on the emulation loop 138. Similar to the process 80, the memory device 10 receives a negative shift of DQS (block 314), receives a write operation as (block 316), and sends an indication of capture success (block 318). However, in the process 300 like in the process 230, the indication may be transmitted via the FS 178 that indicates that the IWS has traversed the WrCMD clone delayline 156 and been captured properly. Also similar to the processes 80 and 230, once the IWS is not properly captured, the memory device 10 receives a positive shift of the DQS away from the failing edge (block 320) and receives an indication of write leveling ending (block 322).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a command interface configured to receive write commands from a host device;
   an input-output interface configured to receive a data strobe and a clock from the host device; and
   internal write circuitry configured to launch an internal write signal based at least in part on the write commands, wherein the internal write circuitry comprises:
      an emulation loop configured to emulate circuitry in a clock path of a write clock generated from the clock, wherein the emulation loop is configured to generate a feedback clock from the write clock;
      a write delay lock loop that is configured to:
         receive the write clock and the feedback clock to determine a number of cycles used to propagate the feedback clock through the emulation loop;
         transmit the number of cycles to the host device to be used as a cycle adjust of the data strobe in an internal write leveling process; and
         complete the internal write leveling process with the host device using the cycle adjust.

2. The memory device of claim 1, wherein the internal write circuitry comprises an input buffer configured to receive the clock from the host device that is used to generate the write clock and the feedback clock, wherein the emulation loop comprises an emulation input buffer configured to emulate the input buffer and to output the feedback clock.

3. The memory device of claim 1, wherein the internal write circuitry comprises a command decoder configured to decode the write commands using the clock, wherein the emulation loop comprises an emulation command decoder configured to emulate the command decoder.

4. The memory device of claim 3, wherein the internal write circuitry comprises a column address strobe write latency (CWL) shifter configured to delay the decoded write commands by CWL, wherein the emulation loop comprises an emulated CWL shifter to emulate the CWL shifter.

5. The memory device of claim 4, wherein the internal write circuitry comprises a forward path used to transmit the delayed and decoded write commands to the write delay lock loop, wherein the emulation loop comprises an emulated forward path configured to emulate the forward path.

6. The memory device of claim 5, wherein the forward path comprises a flip flop comprising:
   an input configured to receive the delayed and decoded write commands;
   a clock input configured to receive the write clock; and
   an output configured to transmit the internal write signal to the write delay lock loop.

7. The memory device of claim 6, wherein write delay lock loop is configured to receive the internal write signal and the write clock based on a same phase of the write clock.

8. The memory device of claim 1, wherein the write delay lock loop comprises an internal write clock delayline configured to delay the feedback clock to align the feedback clock with the write clock.

9. The memory device of claim 8, wherein the write delay lock loop comprises a write command clone delayline configured to receive the internal write signal and to synchronize with the internal write clock delayline to delay the internal write signal.

10. The memory device of claim 9, wherein the internal write signal output from the write command clone delayline is in phase with a clock output from the internal write clock delayline.

11. The memory device of claim 1, wherein the memory device comprises a data strobe path used to internalize the data strobe from the host device.

12. The memory device of claim 11, wherein internal write circuitry comprises a mock data strobe path configured to emulate the data strobe path, and wherein the internal write signal is transmitted from the write delay lock loop through the mock data strobe path to complete the internal write leveling process.

13. A method, comprising:
   outputting a clock to a input-output interface of a memory device;
   outputting a data strobe signal to the input-output interface of a memory device;
   synchronizing the clock and the data strobe signal at a pin of a memory device as an external write leveling operation;
   receiving a write loop delay from write delay lock loop circuitry of the memory device indicating a number of cycles of internal delay of a feedback clock through an emulation loop of the write delay lock loop circuitry;
   setting a cycle adjustment for the data strobe signal based on the number of cycles of internal delay as a coarse adjustment; and
   adjusting the data strobe signal by less than a cycle as a fine adjustment.

14. The method of claim 13, wherein receiving the write loop delay comprises reading the write loop delay from a mode register of the memory device.

15. The method of claim 13, comprising transmitting the cycle adjustment to the memory device.

16. The method of claim 13, wherein the fine adjustment comprises:

incrementally shifting the data strobe signal in a first direction until a capture failure occurs; and after the capture failure occurs, shifting the data strobe signal in a second direction by a half cycle, wherein the second direction is in an opposite direction of the first direction.

17. The method of claim 16, wherein the first direction comprises a negative-shift direction and the second direction comprises a positive-shift direction.

18. A method comprising:

receiving, at a memory device and from a host device, a data strobe and a clock at an input-output interface of the memory device;

calculating, in write delay lock loop circuitry, a loop delay as a number of cycles for the clock to propagate through a delay loop that emulates a clock path for the clock;

transmitting the loop delay to the host device to adjust the data strobe;

receiving, at the memory device and from the host device, a first write command;

attempting to capture the first write command in the memory device;

from the memory device to the host device, sending an indication that the first write command is captured successfully;

receiving, at the memory device and from the host device, a first shift of the data strobe by the host device;

receiving an adjustment to the data strobe based at least in part on the transmitted loop delay;

receiving, at the memory device and from the host device, a second write command;

attempting to capture the second write command in the memory device;

from the memory device to the host device, sending an indication that the capture of the second write command has failed; and in response to sending the indication that capture of the second write command has failed, receiving a second shift of the data strobe by the host device in a direction opposite of the first shift.

19. The method of claim 18, wherein transmitting the loop delay to the host device comprises storing the loop delay to a mode register of the memory device.

20. The method of claim 18, comprising:

receiving, at the memory device, a third write command, wherein the third write command is received between the first and second write commands;

sending an indication that the third write command has been captured successfully when attempting to capture the third write command succeeds; and receiving one or more subsequent write commands until the second write command is not successfully captured, wherein the one or more subsequent write commands comprises the second write command.

* * * * *